(12) United States Patent
Ishii

(10) Patent No.: US 12,713,916 B2
(45) Date of Patent: Aug. 18, 2026

(54) RESIN-SEALED SEMICONDUCTOR DEVICE

(71) Applicant: Mitsubishi Electric Corporation, Tokyo (JP)

(72) Inventor: Ryuichi Ishii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 347 days.

(21) Appl. No.: 18/695,557

(22) PCT Filed: Jan. 11, 2023

(86) PCT No.: PCT/JP2023/000462
§ 371 (c)(1),
(2) Date: Mar. 26, 2024

(87) PCT Pub. No.: WO2023/136264
PCT Pub. Date: Jul. 20, 2023

(65) Prior Publication Data

US 2026/0136927 A1 May 14, 2026

(30) Foreign Application Priority Data

Jan. 13, 2022 (JP) ................................ 2022-003454

(51) Int. Cl.
*H10W 40/20* (2026.01)
*H10W 40/25* (2026.01)
*H10W 74/10* (2026.01)

(52) U.S. Cl.
CPC ....... *H10W 40/233* (2026.01); *H10W 40/258* (2026.01); *H10W 74/111* (2026.01)

(58) Field of Classification Search
None
See application file for complete search history.

(56) References Cited

U.S. PATENT DOCUMENTS

2007/0071994 A1 3/2007 Hayashida et al.
2011/0037166 A1* 2/2011 Ikeda ................. H10W 40/255 257/E23.101

(Continued)

FOREIGN PATENT DOCUMENTS

JP 5-345969 A 12/1993
JP 2004-263210 A 9/2004

(Continued)

OTHER PUBLICATIONS

Communication dated Mar. 5, 2025 in Japanese Application No. 2023-574048.

(Continued)

*Primary Examiner* — Nduka E Ojeh
(74) *Attorney, Agent, or Firm* — Sughrue Mion, PLLC

(57) ABSTRACT

A resin-sealed semiconductor device is configured in such a way that a second bonding material has a melting point higher than that of a first bonding material made of a solder-bonding material, in such a way that one of bonding surfaces through which a power module and a cooling device are bonded to each other with the first bonding material is the other surface portion of a copper plate, and the other one of the bonding surfaces is the surface portion, at the power module side, of the cooling device, and in such a way that the surface portion, at the power module side, of the cooling device is formed of copper or metal having solder wettability the same as or higher than solder wettability of copper.

20 Claims, 3 Drawing Sheets

(56) References Cited

U.S. PATENT DOCUMENTS

| | | | | |
|---|---|---|---|---|
| 2013/0270684 | A1* | 10/2013 | Negishi | H10W 70/461 174/257 |
| 2017/0309544 | A1* | 10/2017 | Kobayashi | H10W 40/47 |
| 2019/0067214 | A1* | 2/2019 | Sato | H10W 42/121 |

FOREIGN PATENT DOCUMENTS

| | | | |
|---|---|---|---|
| JP | 6877600 | B1 | 5/2021 |
| JP | 2021-111765 | A | 8/2021 |

OTHER PUBLICATIONS

International Search Report for International Application No. PCT/JP2023/000462, dated Mar. 14, 2023.

* cited by examiner

RESIN-SEALED SEMICONDUCTOR DEVICE

This is a National Stage Application of International Application No. PCT/JP2023/000462 filed Jan. 11, 2023, claiming priority based on Japanese Patent Application No. 2022-003454 filed Jan. 13, 2022.

TECHNICAL FIELD

The present disclosure relates to a resin-sealed semiconductor device.

BACKGROUND ART

In a semiconductor device in which a power semiconductor element is mounted, a tendency to high capacity has been increasing in recent years. In order to make a large current flow in a power semiconductor element, it is required to make heat to be generated in the semiconductor element efficiently radiate; for that purpose, the thermal resistances of an insulating material and a bonding material existing between the semiconductor element and a cooling device such as a heat sink have been reduced.

For example, in a resin-sealed semiconductor device disclosed in Patent Document 1, as a module bonding material for bonding a power module including a semiconductor element to a cooling device, a solder-bonding material including silver, copper, and bismuth is utilized so that the thermal resistance between the power module and the cooling device is reduced. Moreover, Patent Document 1 has disclosed a technology in which as an on-the-chip bonding material for bonging a lead frame to a semiconductor element in a power module, a solder-bonding material including antimony is utilized and the melting point of the on-the-chip bonding material is made higher than that of the module bonding material, so that when the power module is bonded to the cooling device with the module bonding material, the on-the-chip bonding material is prevented from remelting.

Furthermore, with regard to such the foregoing conventional resin-sealed semiconductor device, there has been proposed a resin-sealed semiconductor device in which in order to raise the solder wettability for a solder-bonding material as the module bonding material, nickel plate is applied to the plane portion, at the side to be bonded to the power module, of the cooling device.

PRIOR ART REFERENCE

Patent Document

[Patent Document 1] Japanese U.S. Pat. No. 6,877,600

DISCLOSURE OF THE INVENTION

Problems to be Solved by the Invention

In the case of the resin-sealed semiconductor device in which in order to raise the solder wettability for a solder-bonding material as the module bonding material, nickel plate is applied to the plane portion, at the side to be bonded to the power module, of the cooling device, it is required to perform soldering work by use of formic-acid reduction reflow facilities or by use of flux having extremely high activation power; however, even when any of these soldering works is performed, there occurs a variation in the solder wettability for the solder-bonding material, as the module bonding material, among individual resin-sealed semiconductor devices. Accordingly, in some cases, a void occurs in the solder-bonding material and hence the thermal resistance increases and the quality is deteriorated; thus, there has been a problem that the reliability of the resin-sealed semiconductor device is lowered.

Moreover, in the case where as the module bonding material, a solder-bonding material is utilized, there has been a problem that repetition of temperature change causes a crack to occur in the solder-bonding material because the solder-bonding material is weak and hence the lifetime of the resin-sealed semiconductor device is shortened.

The present disclosure is to disclose a technology for solving the foregoing problem; the objective thereof is to provide a resin-sealed semiconductor device that realizes enhancement of the reliability and prolongation of the lifetime.

A resin-sealed semiconductor device disclosed in the present disclosure includes a power module and a cooling device that is bonded to the power module with a first bonding material made of a solder-bonding material; the resin-sealed semiconductor device is characterized in that the power module includes a semiconductor element, a heat spreader on one surface portion of which the semiconductor element is mounted, a first lead frame that is an input/output terminal bonded to the heat spreader, a second lead frame that is a main terminal bonded to the semiconductor element through the intermediary of a second bonding material, and a copper plate whose one surface portion is bonded to the other surface portion, of the heat spreader, that faces the one surface portion thereof, through the intermediary of a resin insulating layer, and a molding resin that seals the semiconductor element, the heat spreader, part of the first lead frame, part of the second lead frame, the resin insulating layer, and a portion of the copper plate, other than the other surface portion thereof that faces the one surface portion thereof, in that the second bonding material is made of a bonding material having a melting point higher than that of the first bonding material, in that one of bonding surfaces through which the power module and the cooling device are bonded to each other with the first bonding material is the other surface portion of the copper plate, and the other one of the bonding surfaces is a surface portion, at the power module side, of the cooling device, and in that the surface portion, at the power module side, of the cooling device is formed of copper or metal having solder wettability the same as or higher than solder wettability of copper.

In addition, a resin-sealed semiconductor device disclosed in the present disclosure includes a power module and a cooling device that is bonded to the power module with a first bonding material made of a solder-bonding material; the resin-sealed semiconductor device is characterized in that the power module includes a semiconductor element, an insulated substrate on one surface portion of which the semiconductor element is mounted, a first lead frame that is an input/output terminal bonded to the insulated substrate, a second lead frame that is a main terminal bonded to the semiconductor element through the intermediary of a second bonding material, and a molding resin that seals the semiconductor element, a portion of the insulated substrate, other than the other surface portion thereof that faces the one surface portion thereof, part of the first lead frame, and part of the second lead frame, in that the insulated substrate includes an insulating layer, an upper circuit that is provided on one surface portion of the insulating layer and on which the semiconductor element is mounted, and a lower circuit that is provided on the other surface portion, of the insulating layer, that faces the one surface portion thereof, in that at least in the lower circuit out of the upper circuit and the lower circuit, the other surface portion thereof situated at a side opposite to one surface portion thereof that faces the insulating layer is formed of copper, in that the other surface portion of the insulated substrate is formed of the other surface portion of the lower circuit, in that the second bonding material is made of a bonding material having a melting point higher than that of the first bonding material, in that one of bonding surfaces through which the power module and the cooling device are bonded to each other with the first bonding material is the other surface portion of the lower circuit in the insulated substrate, and the other one of the bonding surfaces is a surface portion, at the power module side, of the cooling device, and in that the surface portion, at the power module side, of the cooling device is formed of copper or metal having solder wettability the same as or higher than solder wettability of copper.

Advantage of the Invention

The present disclosure makes it possible to obtain a resin-sealed semiconductor device that realizes enhancement of the reliability and prolongation of the lifetime.

BEST MODE FOR CARRYING OUT THE INVENTION

Figure 1:
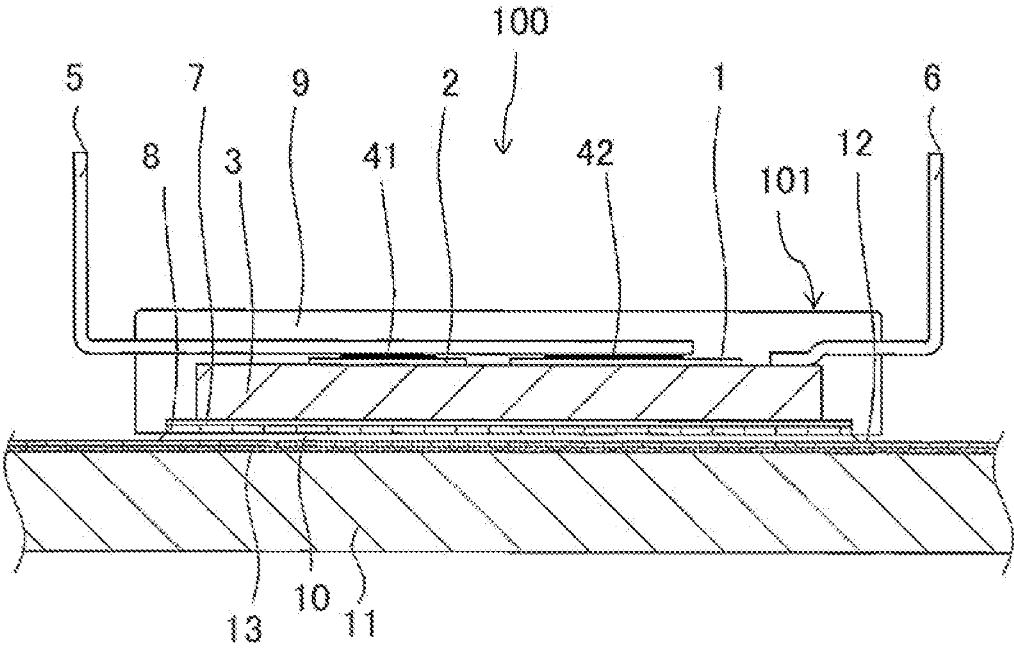
FIG. 1 is a cross-sectional view of a resin-sealed semiconductor device according to Embodiment 1.

Hereinafter, respective resin-sealed semiconductor devices according to Embodiments 1, 2, and 3 will be explained based on the drawings. In each of the drawings, the same reference characters denote the same or similar portions.

Figure 4:
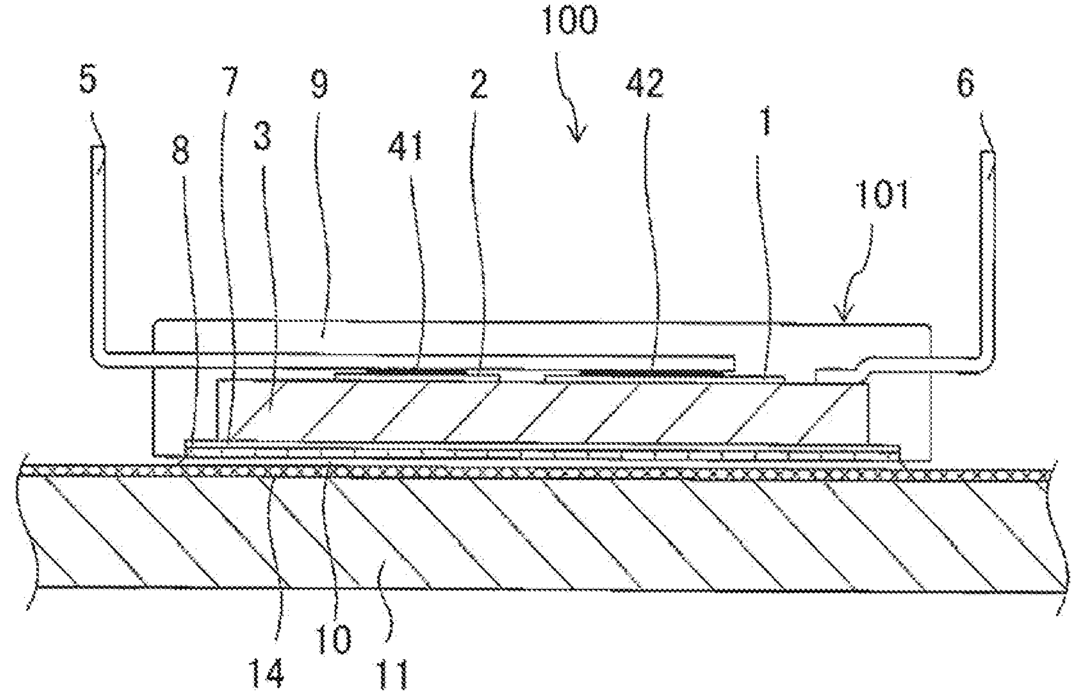
FIG. 4 is a cross-sectional view of a resin-sealed semiconductor device that is a basis of the present disclosure.

At first, a resin-sealed semiconductor device that is a basis of the present disclosure will be explained. FIG. 4 is a cross-sectional view of the resin-sealed semiconductor device that is a basis of the present disclosure. In FIG. 4, the resin-sealed semiconductor device 100 includes a power module 101 and a cooling device 11. The power module 101 has a semiconductor element 1 as a switching element, a semiconductor element 2 as a rectifying element, a copper heat spreader 3, a first copper lead frame 6, which is an input/output terminal, a second copper lead frame 5, which is a main terminal, a resin insulating layer 7, a copper plate 8, and a molding resin 9.

In a die-bonding process at a time of production of the resin-sealed semiconductor device 100, the semiconductor element 1 and the semiconductor element 2 are bonded to one surface portion of the heat spreader 3 through the intermediary of an under-the-chip bonding material (unillustrated). Next, in a first reflow process, the first lead frame 6 is bonded to the surface portion in the end portion of the heat spreader 3 by use of a lead bonding material (unillustrated). In addition, the second lead frame 5 is bonded to respective active planes of the semiconductor element 2 and the semiconductor element 1 by use of on-the-chip bonding materials 41 and 42, as second bonding materials.

Next, in a transfer molding process, under the condition that the other surface portion, of the heat spreader 3, that faces the one surface portion thereof is fixed to one surface portion of the copper plate 8 through the intermediary of the resin insulating layer 7, the molding resin 9 contains and seals the semiconductor element 1, the semiconductor element 2, the heat spreader 3, part of the first lead frame 6, part of the second lead frame 5, the resin insulating layer 7, and the copper plate 8. The other surface portion, of the copper plate 8, that faces the one surface portion thereof is exposed from the bottom surface portion of the molding resin 9 of the power module 101.

Furthermore, in a second reflow process, the exposed surface portion of the copper plate 8 is bonded to a nickel plating layer 14 applied to one surface portion of the cooling device 11, with a module bonding material 10 as a first bonding material. As a result, the power module 101 and the cooling device 11 are integrally bonded to each other, so that the resin-sealed semiconductor device is formed. In order to raise the solder wettability for the module bonding material 10 and to suppress solder voids, the bonding surface between the power module 101 and the cooling device 11 is formed of a combination of copper and nickel plate, so that the quality of the soldering is raised.

In the foregoing resin-sealed semiconductor device, because the nickel plating layer 14 is applied to the surface portion, at the side to be bonded to the power module, of the cooling device 11, it is required to perform soldering work utilizing the module bonding material 10, by use of formic-acid reduction reflow facilities or by use of flux having extremely high activation power; however, even when any of these soldering works is performed, there occurs a variation in the solder wettability for the module bonding material 10, among the individual resin-sealed semiconductor devices 100. Accordingly, in some cases, a void occurs in the solder-bonding material included in the module bonding material 10 and hence the thermal resistance increases, resulting in deterioration of the quality of the resin-sealed semiconductor device 100; thus, the reliability of the resin-sealed semiconductor device 100 may be lowered.

Moreover, because the solder-bonding material included in the module bonding material 10 is weak, repetition of temperature change may cause a crack to occur in the solder-bonding material and hence the lifetime of the resin-sealed semiconductor device 100 may be shortened.

Embodiment 1

Next, a resin-sealed semiconductor device according to Embodiment 1 will be explained. FIG. 1 is a cross-sectional view of the resin-sealed semiconductor device according to Embodiment 1. In FIG. 1, the resin-sealed semiconductor device 100 includes the power module 101 and the cooling device 11. As described later, the power module 101 and the cooling device 11 are bonded to each other with the module bonding material 10 as the first bonding material.

The power module 101 has the semiconductor element 1 as a switching element, the semiconductor element 2 as a rectifying element, the heat spreader 3, the first lead frame 6, the second lead frame 5, the resin insulating layer 7 in which the resin contains inorganic fillers, the copper plate 8, and the molding resin 9. The semiconductor element 1 as a switching element is bonded to one surface portion of the heat spreader 3 through the intermediary of an under-the-chip bonding material (unillustrated). The semiconductor element 2 as a rectifying element is bonded to the one surface portion of the heat spreader 3 through the intermediary of an under-the-chip bonding material (unillustrated). The other surface portion, of the heat spreader 3, that faces the one surface portion thereof is fixed to one surface portion of the copper plate 8 through the intermediary of the resin insulating layer 7.

The other surface portion, of the copper plate 8, that faces the one surface portion thereof is exposed from the bottom surface portion of the molding resin 9 of the power module 101, and is bonded, with the module bonding material 10, to a copper plating layer 12 as a surface plating layer applied to one surface portion of the cooling device 11. In other words, in the bonding surfaces where the power module 101 and the cooling device 11 are bonded to each other with the module bonding material 10 as the first bonding material, one bonding surface is the other surface portion of the copper plate 8 and the other bonding surface is the copper plating layer 12 as a surface plating layer applied to the surface portion, at the power module side, of the cooling device. In such a way as described above, the power module 101 and the cooling device 11 are integrally bonded to each other, so that the resin-sealed semiconductor device 100 is formed.

The first lead frame 6 is integrally bonded to the surface portion, at an end portion, of the heat spreader 3 with a lead bonding material (unillustrated). The lead bonding material is formed of a solder-bonding material in order to secure electric conduction between the heat spreader 3 and the first lead frame 6. In addition, instead of bonding through the lead bonding material, metal bonding through ultrasound may be utilized. The second lead frame 5 is bonded to respective active planes of the semiconductor element 2 and the semiconductor element 1 by use of on-the-chip bonding materials 41 and 42, as second bonding materials.

The molding resin 9 contains the foregoing semiconductor elements 1 and 2, the heat spreader 3, the under-the-chip bonding material, part of the first lead frame 6, the lead bonding material, part of the second lead frame 5, the on-the-chip bonding materials 41 and 42, the resin insulating layer 7, and part of the copper plate 8, and seals these materials from the outside.

In the Resin-sealed Semiconductor Device According to Embodiment 1 configured in such a manner as described above, heat generated at a time when the semiconductor element 1 and the semiconductor element 2 operate is radiated to the cooling device 11 through the under-the-chip bonding material (unillustrated), the heat spreader 3, the resin insulating layer 7, the copper plate 8, the module bonding material 10, the copper plating layer 12 as a surface plating layer, and a nickel plating layer 13 as a base plating layer.

The semiconductor element 1 in the power module 101 is formed of, for example, a semiconductor switching element such as an IGBT (Insulated Gate Bipolar Transistor) or a MOSFET (Metal Oxide Semiconductor Field Effect Transistor). An IGBT is a device for driving a load with a large current. It is desirable that each of the semiconductor element 1 and the semiconductor element 2 is formed of, for example, silicon (Si); however it is not limited to silicon. For example, it is more desirable that a semiconductor chip included in each of the semiconductor element 1 and the semiconductor element 2 is formed of any material selected from a group including silicon carbide (SiC), gallium nitride-based material (for example, gallium nitride (GaN)), and diamond.

The semiconductor material of each of the semiconductor element 1 and the semiconductor element 2 is a so-called wide-bandgap semiconductor material having a wider bandgap than silicon has. Each of the semiconductor element 1 and the semiconductor element 2 formed by use of such a wide-bandgap semiconductor material can be applied to high-temperature operation, in comparison with a semiconductor element formed by use of a silicon semiconductor material such as a MOSFET. A wide-bandgap semiconductor material is suitable for making a large current flow therein.

As described above, the second lead frame 5, which is a main terminal, is bonded to electrodes on respective active planes, as surface portions, of the semiconductor element 2 and the semiconductor element 1 through the intermediary of the on-the-chip bonding materials 41 and 42, respectively, as the second bonding materials formed of a solder-bonding material. High-electric-conductivity metal is utilized for each of the heat spreader 3, the first lead frame 6, and the second lead frame 5. Among high-electric-conductivity metal materials, a copper material is most suitable in terms of the electric resistance, the workability, the cost, and the like. The copper material, here, signifies pure copper or copper alloy whose main component is copper.

As described above, the whole power module 101 is sealed with the molding resin 9. In order to prevent unmatched linear-expansion coefficients from enlarging thermal-deformation power, it is desirable to utilize the molding resin 9 having a linear-expansion coefficient close to the respective linear-expansion coefficients of the heat spreader 3, the first lead frame 6, and the second lead frame 5. Accordingly, because the linear-expansion coefficient of pure copper is from 16 [ppm/K] to 17 [ppm/K], it is desirable that the linear-expansion coefficient of the molding resin 9 is from 15 [ppm/K] to 18 [ppm/K].

It is required that the resin insulating layer 7 not only secures an electrical insulation property but also has a heat radiation property for transferring and radiating heat, generated at a time when the semiconductor element 1 and the semiconductor element 2 operate, to the cooling device 11. The resin insulating layer 7 is obtained by filling an inorganic filler, as an inorganic filling material having a high thermal conductivity and an insulation property, into a thermosetting resin, and bonds the heat spreader 3 to the copper plate 8 through the thermosetting action of the resin.

In order to radiate heat generated at a time when the semiconductor element 1 and the semiconductor element 2 operate, the power module 101 is bonded to the copper plating layer 12, as a surface plating layer of the cooling device 11 having radiating fins (unillustrated), with the module bonding material 10 as the first bonding material. As the cooling device 11 that needs to have a higher cooling performance, any of a water-cooled cooling device and an air-cooled cooling device may be adopted. It is desirable that the cooling device 11 is formed of any material selected from a group including copper, aluminum, and copper alloy or aluminum alloy. Among them, as the material of the cooling device 11, aluminum that is light and superior in the workability or alloy including aluminum is suitable.

In addition, the bonding portion of the cooling device 11 needs to have a high solder wettability, because the power module 101 is bonded to the cooling device 11 with the module bonding material 10. Accordingly, it is desirable that copper is utilized as the material of the main body of the cooling device 11; however, in the case where aluminum or alloy including aluminum is utilized as the material of the main body of the cooling device 11, it is optimum that the surface plating layer is the copper plating layer 12. It is optimum that copper plating is not directly applied to aluminum or alloy including aluminum but the nickel plating layer 13 as a base plating layer is applied thereto in order to raise the plating adhesiveness and the solder wettability of the surface.

As described above, the nickel plating layer 13 as a base plating layer and the copper plating layer 12 as a surface plating layer are applied to the one surface portion of the cooling device 11; two or more radiating fins (unillustrated) are provided on the other surface portion, at the anti-power module side, of the cooling device 11. In addition, in Embodiment 1, the cooling device 11 is formed of metal heat sinks each having the shape of a flat plate; however, it may be allowed that the cooling device 11 is a liquid-cooled cooling device in which a flow path for making cooling liquid flow is provided.

Next, a manufacturing method for the resin-sealed semiconductor device according to Embodiment 1 will be explained. At first, in a die-bonding process, the semiconductor element 1 as a switching element and the semiconductor element 2 as a rectifying element are bonded onto the one surface portion of the heat spreader 3 in such a way as to be spaced apart from each other through the intermediary of under-the-chip bonding materials (unillustrated). The semiconductor element 1 as a switching element is formed of, for example, silicon; a semiconductor chip in which an IGBT is mounted is utilized as the semiconductor element 1. The semiconductor 2 as a rectifying element is formed of, for example, silicon; a semiconductor chip in which a diode is mounted is utilized as the semiconductor element 2.

It is desirable that the under-the-chip bonding material is any bonding material selected from a group including a solder-bonding material, a sinterable filler whose main component is silver, a brazing material whose main component is silver, a material obtained by scattering copper into tin, and a gold-based alloy, such as a gold-tin alloy or a gold-germanium alloy, whose main component is gold. Each of these bonding materials has a high heat conductivity and a high electric conductivity.

Next, in a first reflow process, the first lead frame 6, which is an input/output terminal, is bonded to the surface portion in the end portion of the heat spreader 3 by use of a lead bonding material (unillustrated). In addition, the second lead frame 5, which is a main terminal, is bonded to the active plane of the semiconductor element 1 as a switching element, by use of the on-the-chip bonding material 42, and to the active plane of the semiconductor element 2 as a rectifying element, by use of the on-the-chip bonding material 41.

A lead bonding material (unillustrated) made of a solder-bonding material is utilized for the connection between the heat spreader 3 and the first lead frame 6; however, it may be allowed that another bonding method such as ultrasound bonding or welding is utilized. A solder-bonding material made of constant-thickness ribbon solder is utilized, as each of the on-the-chip bonding materials 41 and 42, for the bonding between the second lead frame 5 and the semiconductor element 1 or the semiconductor element 2.

It is required that as each of the lead bonding material (unillustrated) and the on-the-chip bonding materials 41 and 42, a solder-bonding material having a melting point higher than that of the module bonding material 10 is utilized so that each of the lead bonding material and the on-the-chip bonding materials 41 and 42 does not remelt even at the temperature of a second reflow process where the power module 101 is solder-bonded with the module bonding material 10; thus, it is optimum to utilize a solder-bonding material that includes antimony and whose solidus (melting point) is substantially 240° C. In addition, it may be allowed that each of the on-the-chip bonding materials 41 and 42 is a bonding material, such as a solder-bonding material or sintered silver, including another physical property, as long as it does not remelt even at the temperature of the second reflow process.

Next, in a transfer molding process, the molding resin 9 made of a thermosetting resin seals the semiconductor elements 1 and 2, the heat spreader 3, the under-the-chip bonding material, part of the first lead frame 6, the lead bonding material, part of the second lead frame 5, the on-the-chip bonding materials 41 and 42 as the second bonding materials, the resin insulating layer 7, and the periphery of part of the copper plate 8. In this situation, the molding is performed in such a way that the surface portion, at the anti-resin insulating layer 7 side, of the copper plate 8 is exposed from the molding resin 9.

The resin insulating layer 7 is formed of a material having a heat-radiation property, an insulation property, and an adhesive property, and has a structure in which inorganic powder fillers such as high-heat-conductivity ceramic particles are contained in a thermosetting resin such as an epoxy resin. As the high-heat-conductivity inorganic filling material, a ceramic particle such as aluminum nitride, silicon nitride, boron nitride, aluminum oxide (alumina), silicon oxide (silica), magnesium oxide, zinc oxide, or titanium oxide is suitable. In addition, it may be allowed that any of these inorganic filling materials is utilized alone or two or more thereof are utilized in a mixed manner.

Moreover, the resin insulating layer 7 whose base is a resin material also has a function as an adhesive material. Accordingly, when the molding resin 9 is thermally cured, the resin insulating layer 7 makes the heat spreader 3 and the copper plate 8 bonded to each other in such a way that they adhere to each other. Thus, it is not required to apply an adhesive material to one surface portion and the other surface portion of the resin insulating layer 7. Because the adhesive material may cause the thermal resistance to increase, no adhesive material is applied to the one surface portion and the other surface portion so that the thermal resistance between the resin insulating layer 7 and the heat spreader 3, and eventually, the thermal resistance between the resin insulating layer 7 and the copper plate 8 and thermal resistance between the resin insulating layer 7 and the molding resin 9 can be suppressed from increasing; therefore, a module having a high heat-radiation performance can be obtained.

The molding resin 9 does not need to have a high thermal conductivity; therefore, as the inorganic filling material to be contained in the thermosetting resin such as an epoxy resin, fused silica is optimum among silicon oxides (silicas) that each have high fluidity when being contained in a thermosetting resin and whose linear-expansion coefficients are readily adjusted. Because in the resin-sealed semiconductor device 100, a great amount of copper material is utilized, it is made possible to reduce the stress inside the resin-sealed semiconductor device 100 by making the linear-expansion coefficient of the molding resin 9 correspond to that of copper, i.e., by making the linear-expansion coefficient of the molding resin 9 become one and the same as or approximate to the linear-expansion coefficient of copper; thus, the amount of the inorganic filling material is adjusted in such a way that the linear-expansion coefficient of the molding resin 9 becomes 15 [ppm/K] to 18 [ppm/K]. This method demonstrates an effect that the reliability for a temperature cycle is raised.

Next, in the second reflow process, the power module 101 and the cooling device 11 are bonded to each other by use of the module bonding material 10 as the first bonding material. In the solder reflow, it is required to heat the power module 101 and the cooling device 11 up to a temperature range in which the module bonding material 10 is fused. In this situation, the solder-bonding material utilized in the power module 101 may be fused; provided the solder-bonding material is fused, the effect of volume expansion in which a solid changes into a liquid may cause a crack to occur in the molding resin 9. Therefore, it is required to provide a difference between the melting point of the bonding material such as the solder-bonding material to be utilized inside the power module 101 and the melting point of the module bonding material 10 to be utilized to bond the cooling device 11 to the power module 101.

In the case where as the on-the-chip bonding materials 41 and 42 to be utilized inside the power module 101 and the lead bonding material (unillustrated), there is utilized high-melting-point solder-bonding material in which tin contains antimony and whose liquidus is substantially 240° C., and as the module bonding material 10, there is utilized low-melting-point solder-bonding material in which tin contains silver, copper, bismuth, and indium and whose liquidus is 210° C., the melting-point differences between the module bonding material 10 and the on-the-chip bonding materials 41 and 42 and between the module bonding material 10 and the lead bonding material (unillustrated) become substantially 30° C. Accordingly, sufficient melting-point differences can be provided between the module bonding material 10 and the on-the-chip bonding materials 41 and 42 and between the module bonding material 10 and the lead bonding material; thus, the solder-bonding material in the power module 101 can be prevented from being remelting.

In comparison with low-melting-point solder in which tin contains silver, copper, and bismuth, low-melting-point solder in which tin contains silver, copper, bismuth, and indium has a low liquidus and a high strength, and it is made possible to reduce the incidence of a void by adjusting the respective content ratios of bismuth and indium; therefore, there is demonstrated an effect that the reliability for a temperature cycle is further raised.

In addition, because low-melting-point solder is inferior in the solder wettability to general solder, it is required that the respective bonding surfaces are formed of high-solder-wettability metal materials and flux for raising the solder wettability is indispensable. Because copper is metal having high solder wettability, one of the bonding surfaces where the power module 101 and the cooling device 11 are bonded to each other with the module bonding material 10 as the first bonding material is the other surface portion of the copper plate 8, and the other one of the bonding surfaces is the surface portion, at the power module side, of the cooling device 11; the surface portion, at the power module side, of the cooling device 11 is formed of copper or metal having solder wettability the same as or higher than the solder wettability of copper. As a result, the solder wettability can be raised; concurrently, it is made possible to provide a small-size resin-sealed semiconductor device having a low thermal resistance, a high quality, and a high reliability. In addition, instead of the copper plating layer 12, there may be utilized a metal plating layer, such as a tin plating layer, that has solder wettability the same as or higher than the solder wettability of copper.

The copper plating layer 12 as a surface plating layer and the nickel plating layer 13 as a base plating layer are applied to the area in the surface portion, at the power module side, of the cooling device 11; the foregoing area has a size the same as or larger than the outer-shape size of the power module 101. Accordingly, the power module 101 is bonded to the area to which the copper plating layer 12 as a surface plating layer and the nickel plating layer 13 as a base plating layer are applied, without extending beyond the area.

Embodiment 2

Figure 2:
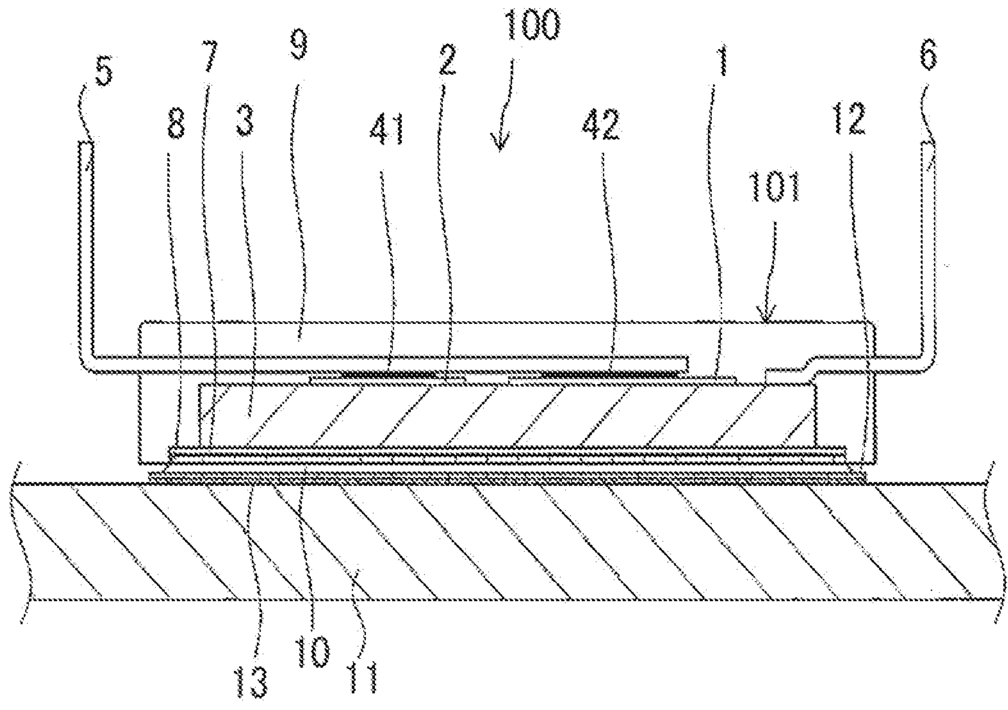
FIG. 2 is a cross-sectional view of a resin-sealed semiconductor device according to Embodiment 2.
Figure 3:
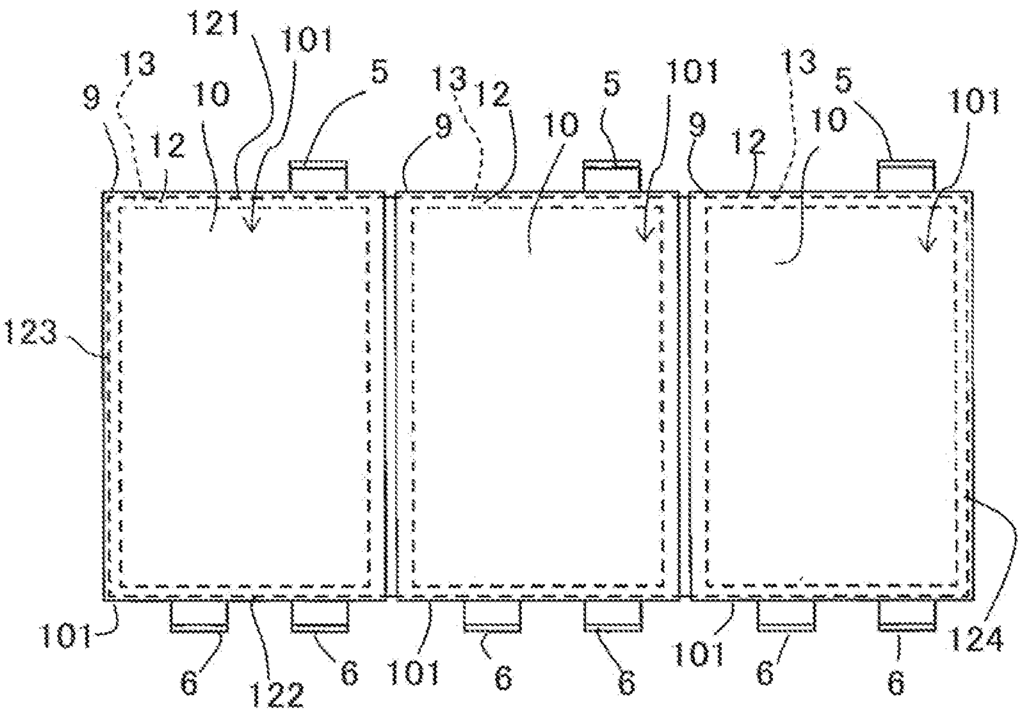
FIG. 3 is a plan view of the resin-sealed semiconductor device according to Embodiment 2.

Next, a resin-sealed semiconductor device according to Embodiment 2 will be explained. FIG. 2 is a cross-sectional view of the resin-sealed semiconductor device according to Embodiment 2; FIG. 3 is a plan view of the resin-sealed semiconductor device according to Embodiment 2. FIG. 3 illustrates a state where three resin-sealed semiconductor devices 100, applied to a three-phase electric-power conversion apparatus, that correspond to the three respective phases are arranged side by side in a plane manner. The difference between the resin-sealed semiconductor device according to Embodiment 2 and the resin-sealed semiconductor device according to Embodiment 1 is only the size of the area to which the copper plating layer 12 as a surface plating layer and the nickel plating layer 13 as a base plating layer are applied.

In FIGS. 2 and 3, the copper plating layer 12 as a surface plating layer and the nickel plating layer 13 as a base plating layer are each formed in the shape of a plane whose outside dimension is one and the same and is larger than the outside dimension of the plane of the module bonding material 10 as the first bonding material. Aluminum, which is a material forming the cooling device 11, is exposed in the area of the cooling device 11 to which neither the copper plating layer 12 nor the nickel plating layer 13 is applied.

Each of the copper plating layer 12 and the nickel plating layer 13 is formed in a rectangular manner, for example, in the shape of a rectangle in such a way that two side portions 121 and 122 thereof facing each other are situated within the planar outer shape of the molding resin 9. Three power modules 101 arranged side by side in a plane manner are bonded to the surface portion of the cooling device 11; each of the copper plating layer 12 and the nickel plating layer 13 are continuously formed in such a way as to stride over the three power modules 101; the copper plating layer 12 is formed in such a way that the other two side portions 123 and 124 thereof, which are each perpendicular to the two side portions 121 and 122 and face each other, are situated within the planar outer shape of the molding resin 9 of the corresponding power module 101.

Because in the second reflow process where the power module 101 is bonded to the cooling device 11 with the module bonding material 10, flux for facilitating the solder wettability is utilized, the activator or gas in the flux causes a solder ball to occur. This solder ball scatters to the surface portion of the cooling device 11; in the case where the destination of the scattering is a place where the solder wettability is provided, the solder ball, as a conductive foreign material, melts and adheres to the surface portion of the cooling device 11 and hence the insulation property may be deteriorated. However, because aluminum does not have any solder wettability, it is made possible that even when a solder ball adheres thereto, the solder ball can readily be removed through cleaning.

In a typical resin-sealed semiconductor device, in order to raise the layout efficiency and to reduce the inductance of the power module 101 as an inverter, for example, the three power modules 101 corresponding to the three respective phases are arranged side by side in a plane manner in such a way as to be close to the surface portion of the cooling device 11; therefore, in comparison with the method in which the area of the copper plating layer 12 as a surface plating layer is divided into respective areas for the power modules 101, the method in which the copper plating layer 12 has the area covering the whole adjacent power modules 101 can suppress the plating cost.

Although a solder ball may melt and adhere to a place between the adjacent power modules 101, the insulation property is not affected by the solder ball, because the side-surface portion of the power module 101, from which the first lead frame 6 is pulled out, and the side-surface portion of the power module 101, from which the second lead frame 5 is pulled out, are different side-surface portions.

Among the methods of applying partial plating to the surface portion of the cooling device 11, the method in which a plating layer is applied to the whole cooling device 11 and then the area other than the copper plating layer 12, which is a surface plating layer, is cut and removed is inexpensive; however, there may be utilized a method in which at a time of plating, partial plating is performed while masking an area where no plating is required.

Embodiment 3

Figure 5:
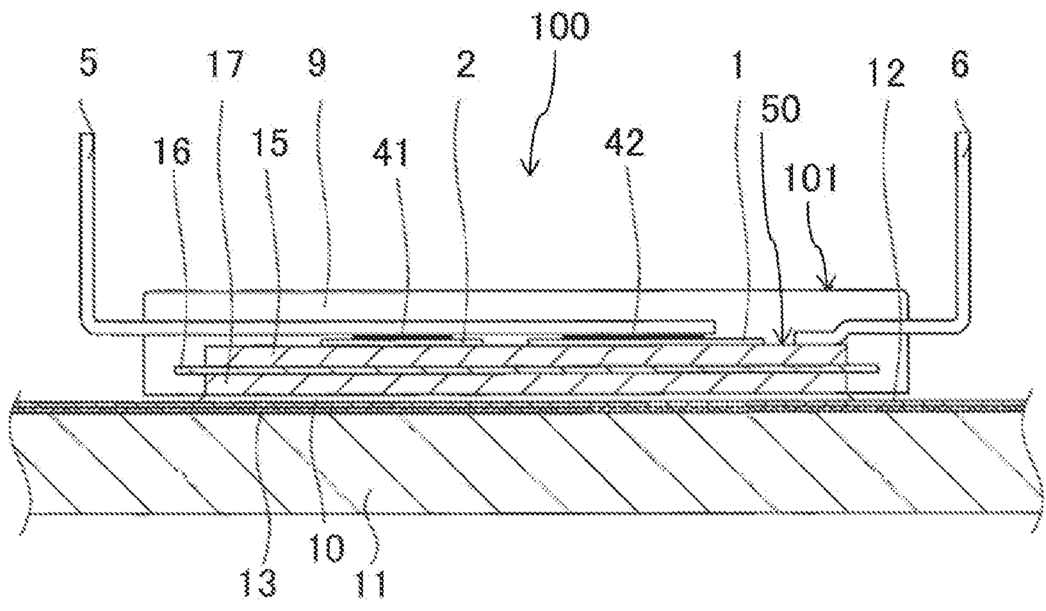
FIG. 5 is a cross-sectional view of a resin-sealed semiconductor device according to Embodiment 3.

Next, a resin-sealed semiconductor device according to Embodiment 3 will be explained. FIG. 5 is a cross-sectional view of the resin-sealed semiconductor device according to Embodiment 3. The difference between the resin-sealed semiconductor device according to Embodiment 3 and the resin-sealed semiconductor device according to Embodiment 1 is only the insulation structure inside the power module 101; instead of the heat spreader 3, the resin insulating layer 7, and the copper plate 8 in FIG. 1 of Embodiment 1, an upper circuit 15, a ceramic insulating layer 16, and a lower circuit 17, respectively, are provided in Embodiment 3 represented in FIG. 5.

In FIG. 5, the resin-sealed semiconductor device 100 includes the power module 101 and the cooling device 11. The power module 101 and the cooling device 11 are bonded to each other with the module bonding material 10 as the first bonding material.

The power module 101 has the semiconductor element 1 as a switching element, the semiconductor element 2 as a rectifying element, the upper circuit 15, the ceramic insulating layer 16, the lower circuit 17, the first lead frame 6, the second lead frame 5, and the molding resin 9. The upper circuit 15, the ceramic insulating layer 16, and the lower circuit 17 form an insulated substrate 50. Each of the upper circuit 15 and the lower circuit 17 is formed of, for example, copper. In addition, it may be allowed that at least in the lower circuit 17 out of the upper circuit 15 and the lower circuit 17, the other surface portion thereof situated at the side opposite to one surface portion that faces the ceramic insulating layer 16 is formed of copper.

In general, in an insulated substrate, an electric conductor, such as a copper plate, on which a semiconductor element is mounted is referred to as an upper circuit, and an electric conductor, such as a copper plate, on which no semiconductor element is mounted is referred to as a lower circuit. In FIG. 5, the semiconductor element 1 as a switching element, the semiconductor element 2 as a rectifying element are mounted on the upper circuit 15 included in the insulated substrate 50; the upper circuit 15 is formed of, for example, a single copper plate without pattern segmentation. In addition, no semiconductor element is mounted on the lower circuit 17 included in the insulated substrate 50; the lower circuit 17 is formed of, for example, a single copper plate without pattern segmentation.

The semiconductor element 1 as a switching element is bonded to the one surface portion of the insulated substrate 50 through the intermediary of an under-the-chip bonding material (unillustrated). The semiconductor element 2 as a rectifying element is bonded to the one surface portion of the insulated substrate 50 through the intermediary of an under-the-chip bonding material (unillustrated).

The molding resin 9 contains the foregoing semiconductor elements 1 and 2, the upper circuit 15, the ceramic insulating layer 16, the under-the-chip bonding material, part of the first lead frame 6, the lead bonding material, part of the second lead frame 5, the on-the-chip bonding materials 41 and 42, and part of the lower circuit 17, and seals these materials from the outside.

The other surface portion, of the lower circuit 17 of the insulated substrate 50, that is situated at the side opposite to the one surface portion facing the ceramic insulating layer 16 as an insulating layer is exposed from the bottom surface portion of the molding resin 9 of the power module 101, and is bonded, with the module bonding material 10, to the copper plating layer 12 as a surface plating layer applied to one surface portion of the cooling device 11. In other words, in the bonding surfaces where the power module 101 and the cooling device 11 are bonded to each other with the module bonding material 10 as the first bonding material, one bonding surface is the other surface portion of the copper lower circuit 17 and the other bonding surface is the copper plating layer 12 as a surface plating layer applied to the surface portion, at the power module side, of the cooling device. In such a way as described above, the power module 101 and the cooling device 11 are integrally bonded to each other, so that the resin-sealed semiconductor device 100 is formed.

The first lead frame 6 is integrally bonded to the surface portion, at an end portion, of the insulated substrate 50 with a lead bonding material (unillustrated). The lead bonding material is formed of a solder-bonding material in order to secure electric conduction between the insulated substrate 50 and the first lead frame 6. In addition, instead of bonding through the lead bonding material, metal bonding through ultrasound may be utilized. The second lead frame 5 is bonded to respective active planes of the semiconductor element 2 and the semiconductor element 1 by use of on-the-chip bonding materials 41 and 42, as second bonding materials.

In the resin-sealed semiconductor device according to Embodiment 3 configured in such a manner as described above, heat generated at a time when the semiconductor element 1 and the semiconductor element 2 operate is radiated to the cooling device 11 through the under-the-chip bonding material (unillustrated), the upper circuit 15 in the insulated substrate 50, the ceramic insulating layer 16 in the insulated substrate 50, the lower circuit 17 in the insulated substrate 50, the module bonding material 10, the copper plating layer 12 as a surface plating layer, and the nickel plating layer 13 as a base plating layer.

In a die-bonding process, the semiconductor element 1 and the semiconductor element 2 are bonded to the one surface portion of the insulated substrate 50, through the intermediary of the under-the-chip bonding material (unillustrated); the insulated substrate 50 is configured in such a way that in the production of the resin-sealed semiconductor device 100, the copper upper circuit 15 having a thickness of substantially 1 mm is brazed to the front surface of the ceramic insulating layer 16 made of silicon nitride or aluminum nitride, and the copper lower circuit 17 having a thickness of substantially 1 mm is brazed to the rear surface of the ceramic insulating layer 16.

Next, in a first reflow process, the first lead frame 6 is bonded to the surface portion in the end portion of the upper circuit 15 in the insulated substrate 50 by use of a lead bonding material (unillustrated). In addition, the second lead frame 5 is bonded to respective active planes of the semiconductor element 2 and the semiconductor element 1 by use of on-the-chip bonding materials 41 and 42, as second bonding materials.

Next, in a transfer molding process, the molding resin 9 contains the semiconductor element 1 and the semiconductor element 2, the upper circuit 15, the ceramic insulating layer 16, part of the lower circuit 17, part of the first lead frame 6, and part of the second lead frame 5, and seals these materials. The other surface portion, of the insulated substrate 50, that faces the one surface portion thereof is formed of the rear surface of the copper lower circuit 17. The rear surface, of the lower circuit 17, that forms the other surface portion of the insulated substrate 50 is exposed from the bottom surface portion of the molding resin 9 of the power module 101.

As is the case with the resin insulating layer 7 according to Embodiment 1, it is required that the resin insulating layer 16 not only secures an electrical insulation property but also has a heat radiation property for transferring and radiating heat, generated at a time when the semiconductor element 1 and the semiconductor element 2 operate, to the cooling device 11. The ceramic insulating layer 16 is a sintered body having a high thermal conductivity and an insulation property; because the ceramic insulating layer 16 has a heat conductivity ten or more times as large as that of the resin insulating layer 7 according to Embodiment 1, there can be raised the heat radiation property for the heat generated at a time when the semiconductor element 1 and the semiconductor element 2 operate, even when the thickness of the upper circuit 15 and the lower circuit 17 is reduced to substantially half of the thickness of the heat spreader 3 represented in FIG. 1 of Embodiment 1; thus, the thermal resistance and the size of the power module 101 can be reduced.

In addition, the bonding portion of the cooling device 11 needs to have a high solder wettability, because the power module 101 is bonded to the cooling device 11 with the module bonding material 10. Accordingly, it is desirable that copper is utilized as the material of the main body of the cooling device 11; however, in the case where aluminum or alloy including aluminum is utilized as the material of the main body of the cooling device 11, it is optimum that the surface plating layer is the copper plating layer 12. It is optimum that copper plating is not directly applied to aluminum or alloy including aluminum but the nickel plating layer 13 as a base plating layer is applied thereto in order to raise the plating adhesiveness and the solder wettability of the surface.

As described above, the nickel plating layer 13 as a base plating layer and the copper plating layer 12 as a surface plating layer are applied to the one surface portion of the cooling device 11; two or more radiating fins (unillustrated) are provided on the other surface portion, at the anti-power module side, of the cooling device 11. In addition, it may be allowed that the cooling device 11 is a liquid-cooled cooling device in which a flow path for making cooling liquid flow is provided.

Although in the insulated substrate 50, the upper circuit 15 and the lower circuit 17 are brazed to the front surface and the rear surface, respectively, of the ceramic insulating layer 16, it is not required that these materials are integrated; it may be allowed that they are bonded to one another through a transfer molding process. Moreover, it may be allowed that the ceramic insulating layer 16 is formed of ceramics only; alternatively, it may be allowed that the ceramic insulating layer 16 is formed of, for example, a composite material of ceramics and a resin, as long as this material can satisfy the electrical insulation property and the heat radiation property.

Although the present application is described above in terms of various exemplary embodiments and implementations, it should be understood that the various features, aspects and functions described in one or more of the individual embodiments are not limited in their applicability to the particular embodiment with which they are described, but instead can be applied, alone or in various combinations to one or more of the embodiments. Therefore, an infinite number of unexemplified variant examples are conceivable within the range of the technology disclosed in the present application. For example, there are included the case where at least one constituent element is modified, added, or omitted and the case where at least one constituent element is extracted and then combined with constituent elements of other embodiments.

DESCRIPTION OF REFERENCE NUMERALS

100: resin-sealed semiconductor device
101: power module
1, 2: semiconductor element
3: heat spreader
41, 42: on-the-chip bonding material
5: second lead frame
6: first lead frame
7: resin insulating layer
8: copper plate
9: molding resin
10: module bonding material
11: cooling device
12: copper plating layer
13, 14: nickel plating layer
15: upper circuit
16: ceramic insulating layer
17: lower circuit
50: insulated substrate

The invention claimed is:

1. A resin-sealed semiconductor device comprising:

a power module; and a cooling device that is bonded to the power module with a first bonding material made of a solder-bonding material, wherein the power module includes a semiconductor element, a heat spreader on one surface portion of which the semiconductor element is mounted, a first lead frame that is an input/output terminal bonded to the heat spreader, a second lead frame that is a main terminal bonded to the semiconductor element through the intermediary of a second bonding material, a copper plate whose one surface portion is bonded to the other surface portion, of the heat spreader, that faces the one surface portion thereof, through the intermediary of a resin insulating layer, and a molding resin that seals the semiconductor element, the heat spreader, part of the first lead frame, part of the second lead frame, the resin insulating layer, and a portion of the copper plate, other than the other surface portion thereof that faces the one surface portion thereof, wherein the second bonding material is made of a bonding material having a melting point higher than that of the first bonding material, wherein one of bonding surfaces through which the power module and the cooling device are bonded to each other with the first bonding material is the other surface portion of the copper plate, and the other one of the bonding surfaces is a surface portion, at the power module side, of the cooling device, and wherein the surface portion, at the power module side, of the cooling device is formed of copper or metal having solder wettability the same as or higher than solder wettability of copper.

2. The resin-sealed semiconductor device according to claim 1, wherein the cooling device is formed of copper, and wherein the surface portion, at the power module side, of the cooling device is formed of copper forming the cooling device.

3. The resin-sealed semiconductor device according to claim 2, wherein the second bonding material contains at least bismuth and indium.

4. The resin-sealed semiconductor device according to claim 1, wherein the cooling device is formed of aluminum or an alloy containing aluminum, and wherein the surface portion, at the power module side, of the cooling device is formed of a copper plating layer applied to the surface portion, at the power module side, of the cooling device or a metal plating layer having solder wettability the same as or higher than solder wettability of copper.

5. The resin-sealed semiconductor device according to claim 4, wherein the copper plating layer or the metal plating layer having solder wettability the same as or higher than solder wettability of copper is applied to the surface portion, at the power module side, of the cooling device through the intermediary of a nickel plating layer.

6. The resin-sealed semiconductor device according to claim 5, wherein the copper plating layer or the metal plating layer having solder wettability the same as or higher than solder wettability of copper is formed in such a way that two side portions thereof facing each other are situated within a planar outer shape of the molding resin.

7. The resin-sealed semiconductor device according to claim 6, wherein on the surface portion of the cooling device, there are provided two or more pieces of the power modules that are arranged side by side in a plane manner, wherein the copper plating layer or the metal plating layer having solder wettability the same as or higher than solder wettability of copper is continuously formed in such a way as to stride over the two or more pieces of the power modules, and wherein the copper plating layer or the metal plating layer having solder wettability the same as or higher than solder wettability of copper is formed in such a way that the other two side portions, which are each perpendicular to the two side portions and face each other, are each situated within a planar outer shape of the molding resin of the corresponding power module.

8. The resin-sealed semiconductor device according to claim 4, wherein the copper plating layer or the metal plating layer having solder wettability the same as or higher than solder wettability of copper is formed in such a way that two side portions thereof facing each other are situated within a planar outer shape of the molding resin.

9. The resin-sealed semiconductor device according to claim 8, wherein on the surface portion of the cooling device, there are provided two or more pieces of the power modules that are arranged side by side in a plane manner, wherein the copper plating layer or the metal plating layer having solder wettability the same as or higher than solder wettability of copper is continuously formed in such a way as to stride over the two or more pieces of the power modules, and wherein the copper plating layer or the metal plating layer having solder wettability the same as or higher than solder wettability of copper is formed in such a way that the other two side portions, which are each perpendicular to the two side portions and face each other, are each situated within a planar outer shape of the molding resin of the corresponding power module.

10. The resin-sealed semiconductor device according to claim 1, wherein the second bonding material contains at least bismuth and indium.

11. A resin-sealed semiconductor device comprising:

a power module; and a cooling device that is bonded to the power module with a first bonding material made of a solder-bonding material, wherein the power module includes a semiconductor element, an insulated substrate on one surface portion of which the semiconductor element is mounted, a first lead frame that is an input/output terminal bonded to the insulated substrate, a second lead frame that is a main terminal bonded to the semiconductor element through the intermediary of a second bonding material, and a molding resin that seals the semiconductor element, a portion of the insulated substrate, other than the other surface portion thereof that faces the one surface portion thereof, part of the first lead frame, and part of the second lead frame, wherein the insulated substrate includes an insulating layer, an upper circuit that is provided on one surface portion of the insulating layer and on which the semiconductor element is mounted, and a lower circuit that is provided on the other surface portion, of the insulating layer, that faces the one surface portion thereof, wherein at least in the lower circuit out of the upper circuit and the lower circuit, the other surface portion thereof situated at a side opposite to one surface portion thereof that faces the insulating layer is formed of copper, wherein the other surface portion of the insulated substrate is formed of the other surface portion of the lower circuit, wherein the second bonding material is made of a bonding material having a melting point higher than that of the first bonding material, wherein one of bonding surfaces through which the power module and the cooling device are bonded to each other with the first bonding material is the other surface portion of the lower circuit in the insulated substrate, and the other one of the bonding surfaces is a surface portion, at the power module side, of the cooling device, and wherein the surface portion, at the power module side, of the cooling device is formed of copper or metal having solder wettability the same as or higher than solder wettability of copper.

12. The resin-sealed semiconductor device according to claim 11, wherein the cooling device is formed of copper, and wherein the surface portion, at the power module side, of the cooling device is formed of copper forming the cooling device.

13. The resin-sealed semiconductor device according to claim 12, wherein the second bonding material contains at least bismuth and indium.

14. The resin-sealed semiconductor device according to claim 11, wherein the cooling device is formed of aluminum or an alloy containing aluminum, and wherein the surface portion, at the power module side, of the cooling device is formed of a copper plating layer applied to the surface portion, at the power module side, of the cooling device or a metal plating layer having solder wettability the same as or higher than solder wettability of copper.

15. The resin-sealed semiconductor device according to claim 14, wherein the copper plating layer or the metal plating layer having solder wettability the same as or higher than solder wettability of copper is applied to the surface portion, at the power module side, of the cooling device through the intermediary of a nickel plating layer.

16. The resin-sealed semiconductor device according to claim 15, wherein the copper plating layer or the metal plating layer having solder wettability the same as or higher than solder wettability of copper is formed in such a way that two side portions thereof facing each other are situated within a planar outer shape of the molding resin.

17. The resin-sealed semiconductor device according to claim 16, wherein on the surface portion of the cooling device, there are provided two or more pieces of the power modules that are arranged side by side in a plane manner, wherein the copper plating layer or the metal plating layer having solder wettability the same as or higher than solder wettability of copper is continuously formed in such a way as to stride over the two or more pieces of the power modules, and wherein the copper plating layer or the metal plating layer having solder wettability the same as or higher than solder wettability of copper is formed in such a way that the other two side portions, which are each perpendicular to the two side portions and face each other, are each situated within a planar outer shape of the molding resin of the corresponding power module.

18. The resin-sealed semiconductor device according to claim 14, wherein the copper plating layer or the metal plating layer having solder wettability the same as or higher than solder wettability of copper is formed in such a way that two side portions thereof facing each other are situated within a planar outer shape of the molding resin.

19. The resin-sealed semiconductor device according to claim 18, wherein on the surface portion of the cooling device, there are provided two or more pieces of the power modules that are arranged side by side in a plane manner, wherein the copper plating layer or the metal plating layer having solder wettability the same as or higher than solder wettability of copper is continuously formed in such a way as to stride over the two or more pieces of the power modules, and wherein the copper plating layer or the metal plating layer having solder wettability the same as or higher than solder wettability of copper is formed in such a way that the other two side portions, which are each perpendicular to the two side portions and face each other, are each situated within a planar outer shape of the molding resin of the corresponding power module.

20. The resin-sealed semiconductor device according to claim 11, wherein the second bonding material contains at least bismuth and indium.

* * * * *